United States Patent
Dakshina-Murthy et al.

(10) Patent No.: US 6,579,801 B1
(45) Date of Patent: Jun. 17, 2003

(54) METHOD FOR ENHANCING SHALLOW TRENCH TOP CORNER ROUNDING USING ENDPOINT CONTROL OF NITRIDE LAYER ETCH PROCESS WITH APPROPRIATE ETCH FRONT

(75) Inventors: Srikanteswara Dakshina-Murthy, Austin, TX (US); Christoph Schwan, Gebhardshain (DE); Jeffrey C. Haines, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 27 days.

(21) Appl. No.: 09/997,986

(22) Filed: Nov. 30, 2001

(51) Int. Cl.[7] .............................................. H01L 21/311
(52) U.S. Cl. ...................... 438/700; 438/723; 438/724
(58) Field of Search ................................. 438/723, 724, 438/221, 424, 425, 426, 700, 706, 707, 710–714, 719

(56) References Cited

U.S. PATENT DOCUMENTS

| | | | |
|---|---|---|---|
| 5,578,518 A | * 11/1996 | Koike et al. ................. 438/424 |
| 5,807,789 A | 9/1998 | Chen et al. .................. 438/700 |
| 5,858,857 A | * 1/1999 | Ho .............................. 438/424 |
| 5,910,018 A | 6/1999 | Jang ............................ 438/714 |
| 5,994,229 A | 11/1999 | Chen et al. .................. 438/425 |
| 6,040,232 A | * 3/2000 | Gau ............................ 438/424 |
| 6,218,309 B1 | * 4/2001 | Miller et al. ................ 438/700 |
| 6,287,974 B1 | * 9/2001 | Miller ........................ 438/706 |

* cited by examiner

*Primary Examiner*—Kin-Chan Chen
(74) *Attorney, Agent, or Firm*—Timothy M. Honeycutt

(57) ABSTRACT

Various methods of fabricating substrate trenches and isolation structures therein are disclosed. In one aspect, a method of fabricating a trench in a substrate is provided. An oxide/nitride stack is formed on the substrate. An opening with opposing sidewalls is plasma etched in the silicon nitride film until a first portion of the oxide film is exposed while second and third portions of the oxide film positioned on opposite sides of the first portion remain covered by first and second portions of the silicon nitride film that project inwardly from the opposing sidewalls. The oxide film is etched for a selected time period in order to expose a portion of the substrate and to define first and second oxide/nitride ledges that project inwardly from the opposing sidewalls. The substrate is etched to form the trench with the first and second oxide/nitride ledges protecting underlying portions of the substrate.

26 Claims, 6 Drawing Sheets

METHOD FOR ENHANCING SHALLOW TRENCH TOP CORNER ROUNDING USING ENDPOINT CONTROL OF NITRIDE LAYER ETCH PROCESS WITH APPROPRIATE ETCH FRONT

BACKGROUND OF THE INVENTION

1. Field of the Invention

This invention relates generally to semiconductor processing, and more particularly to methods of fabricating substrate trenches and isolation structures therein.

2. Description of the Related Art

The implementation of integrated circuits involves connecting isolated circuit devices through specific electrical pathways. Where integrated circuits are implemented in silicon, it is necessary, therefore, to initially isolate the various circuit devices built into the silicon substrate from one another. The circuit devices are thereafter interconnected to create specific circuit configurations through the use of global interconnect or metallization layers and local interconnect layers.

Local oxidation of silicon ("LOCOS") and trench and refill isolation represent two heavily used isolation techniques for both bipolar and metal oxide semiconductor ("MOS") circuits. In a conventional semi-recessed LOCOS process, a thin pad oxide layer is thermally grown on a silicon substrate surface and coated with a layer of chemical vapor deposition ("CVD") silicon nitride. The active regions of the substrate are then defined with a photolithographic step. The nitride layer is then dry etched and the pad oxide layer wet or dry etched with the photoresist left in place to serve as a masking layer for a subsequent channel stop implant. After the channel stop implant, field oxide regions are thermally grown by means of a wet oxidation step. The oxidation of the silicon proceeds both vertically into the substrate and laterally under the edges of the nitride layer, resulting in the formation of structures commonly known as bird's beaks.

The formation of bird's beak structures is problematic in a number of ways. To begin with, bird's beak formation can create significant limitations on the packing density of devices in an integrated circuit. Design rules for LOCOS processes must restrict the gaps between adjacent devices to account for the lateral encroachment of bird's beaks. In addition, the very shape of a bird's beak can result in the exposure of the substrate surface during subsequent overetching to open contacts for metallization. This can result in the source of the transistor becoming shorted to the well region when the metal interconnect film is deposited. This problem may be particularly acute in CMOS circuits where shallower junctions are used, due to the higher propensity for the exposure of the well regions. While some improvement in the formation of bird's beak structures has occurred as a result of the introduction of techniques such as the etchback of portions of the field oxide structures, deposition of a silicon nitride layer without a pad oxide layer, and use of a thin pad oxide covered with polysilicon, the difficulties associated with bird's beak formation have not been completely eliminated.

In trench-based isolation structures, a damascene process is used to pattern and etch a plurality of trenches in the silicon substrate. The trenches are then provided with an oxide liner and then filled with a CVD silicon dioxide or doped glass layer that is planarized back to the substrate surface using etchback planarization or chemical mechanical polishing ("CMP"). Although conventional trench and refill isolation techniques eliminate the difficulties associated with bird's beak formation in LOCOS processes, there are nevertheless difficulties associated with the trench and refill isolation techniques.

One potential disadvantage associated with the conventional trench process just described is the lateral encroachment of the liner oxide layer into active device regions on either side of the trench. This can lead to reductions in the maximum drive current for devices formed in the active regions. Another potential pitfall is the possibility of unwanted etch attack of the substrate in the vicinity of the upper corners of the trench during subsequent removal of the protective layers formed on the substrate prior to trench etch. Normally an oxide/nitride stack is formed on the substrate prior to trench etch to provide hard masking of the substrate. These layers are typically removed following refill and planarization. In conventional processing, the upper corners of the trench are positioned beneath the edges of the silicon nitride film and the pad oxide film. As a consequence, the bulk refill material will not cover and protect the trench corners. The liner oxide layer at the corners can be easily compromised, producing an unwanted etch attack of the substrate proximate the corners. Stringers of conducting material may form in the dished regions and lead to shorts between devices.

Another potential shortcoming of the conventional process is the limitation on trench corner rounding. In the conventional trench formation process, the silicon trench corner is present directly under the pad oxide/nitride following trench etch. Thus, any subsequent trench liner oxidation process cannot easily oxidize the silicon in the corner region since the pad oxide/nitride acts as a diffusion barrier. This reduces the ability of the liner oxide to provide adequate trench corner rounding, which is necessary for robust operation of a subsequently formed device. The trench corners define the extremities of the active device, such as a transistor, along a perpendicularly formed gate, and sharp corners translate into higher fields in the source/drain at these locations, leading to a possibility of premature junction breakdown and higher leakage. Sharp corners also result in higher mechanical stresses when thermal oxides are gown, and may give rise to stress-relieving dislocations in the substrate material, which can lead to junction shorts by the formation of diffusion pipes.

The present invention is directed to overcoming or reducing the effects of one or more of the foregoing disadvantages.

SUMMARY OF THE INVENTION

In accordance with one aspect of the present invention, a method of fabricating a trench in a substrate is provided. An oxide film is formed on the substrate and a silicon nitride film is formed on the oxide film. An opening with opposing sidewalls is etched in the silicon nitride film with a plasma until a first portion of the oxide film is exposed while second and third portions of the oxide film positioned on opposite sides of the first portion of the oxide film remain covered by first and second portions of the silicon nitride film that project inwardly from the opposing sidewalls. The oxide film is etched for a selected time period in order to expose a portion of the substrate. The first and second portions of the silicon nitride film protect the second and third portions of the oxide film whereby first and second oxide/nitride ledges are defined that project inwardly from the opposing sidewalls. The substrate is etched to form the trench. The first and second oxide/nitride ledges protect underlying portions of the substrate whereby the trench forms with opposing shoulders projecting inwardly from the respective opposing sidewalls of the silicon nitride film.

In accordance with another aspect of the present invention, a method of fabricating an isolation structure on a substrate is provided. An oxide film is formed on the substrate and a silicon nitride film is formed on the oxide film. An opening with opposing sidewalls is etched in the silicon nitride film with a plasma until a first portion of the oxide film is exposed while second and third portions of the oxide film positioned on opposite sides of the first portion of the oxide film remain covered by first and second portions of the silicon nitride film that project inwardly from the opposing sidewalls. The oxide film is etched for a selected time period in order to expose a portion of the substrate. The first and second portions of the silicon nitride film protect the second and third portions of the oxide film whereby first and second oxide/nitride ledges are defined that project inwardly from the opposing sidewalls. The substrate is etched to form the trench. The first and second oxide/nitride ledges protect underlying portions of the substrate whereby the trench forms with opposing shoulders projecting inwardly from the respective opposing sidewalls of the silicon nitride film. An insulator structure is formed in the trench.

In accordance with another aspect of the present invention, a method of fabricating a trench in a silicon substrate is provided. An oxide film is formed on the silicon substrate and a silicon nitride film is formed on the oxide film. An opening with opposing sidewalls is etched in the silicon nitride film with a plasma until emission spectroscopy of the plasma indicates that a first portion of the oxide film is exposed while second and third portions of the oxide film positioned on opposite sides of the first portion of the oxide film remain covered by first and second portions of the silicon nitride film that project inwardly from the opposing sidewalls. The oxide film is etched for a selected time period in order to expose a portion of the silicon substrate. The first and second portions of the silicon nitride film protect the second and third portions of the oxide film whereby first and second oxide/nitride ledges are defined that project inwardly from the opposing sidewalls. The silicon substrate is etched to form the trench. The first and second oxide/nitride ledges protect underlying portions of the silicon substrate whereby the trench forms with opposing shoulders projecting inwardly from the respective opposing sidewalls of the silicon nitride film.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Figure 1:
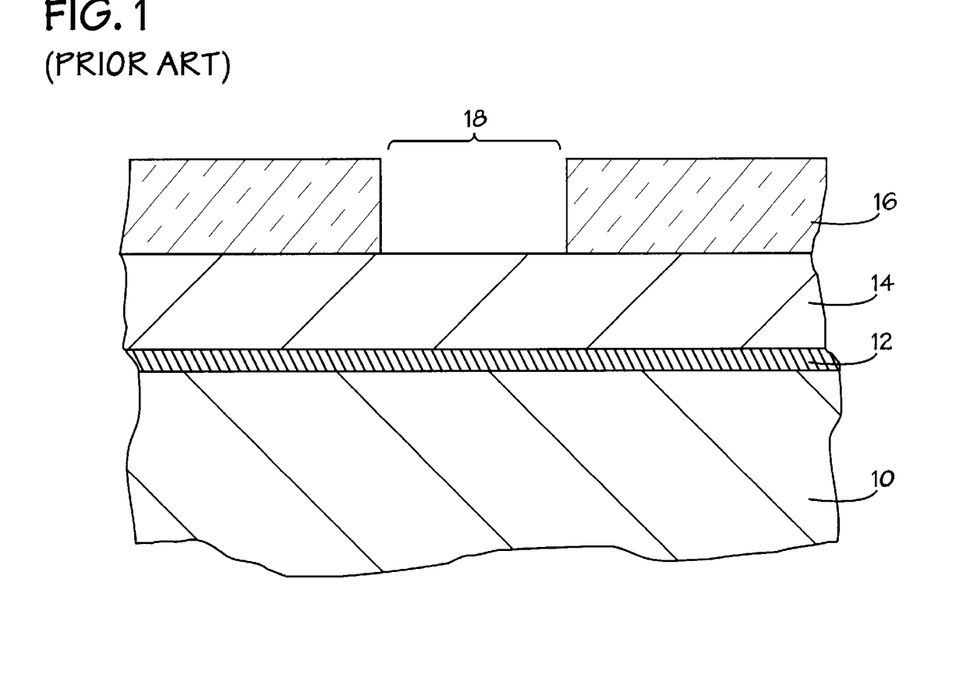
FIG. 1 is a cross-sectional view of an exemplary conventional substrate with a pad oxide layer, a silicon nitride layer and an etch mask thereon.

In the drawings described below, reference numerals are generally repeated where identical elements appear in more than one figure. Turning now to the drawings, FIGS. 1–4 depicts successive cross-sectional views of a semiconductor substrate 10 and illustrate exemplary conventional process for fabricating an isolation structure trench. Turning initially to FIG. 1, a pad oxide film 12 is formed by well-known thermal oxidation techniques. Thereafter, a silicon nitride film 14 is deposited on the pad oxide film 12 by CVD. A photomask 16 is thereafter formed on the silicon nitride film 14 with an opening 18 corresponding to the desired layout of a later-formed isolation trench.

Figure 2:
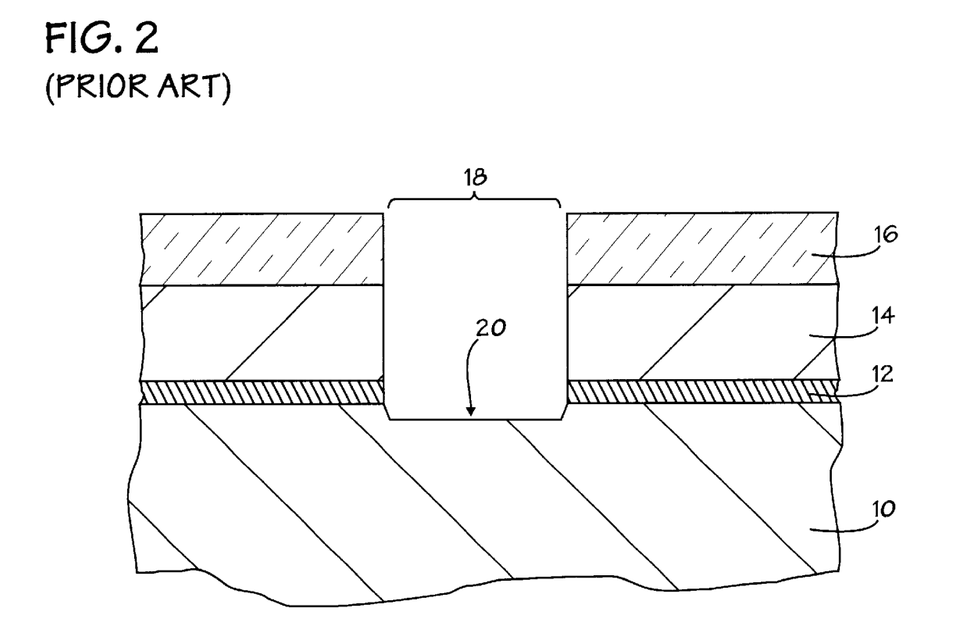
FIG. 2 is a cross-sectional view like FIG. 1 depicting conventional directional etching of an opening in the silicon nitride and oxide films.

Referring now to FIG. 2, an anisotropic etch of the silicon nitride film 14 and the underlying pad oxide film 12 is performed with the photomask 16 serving as an etch mask. One conventional etch chemistry employs, for example, $CF_4$ and $O_2$ in a reactive ion etch ("RIE"). The silicon nitride/pad oxide etch is typically performed with a main etch step followed by one or more over etch steps. In each phase of the etch process, endpoint is determined by timing. The main etch and the overetch steps normally last long enough to expose and attack the underlying silicon substrate 10, producing a shallow trench 20 therein.

Figure 3:
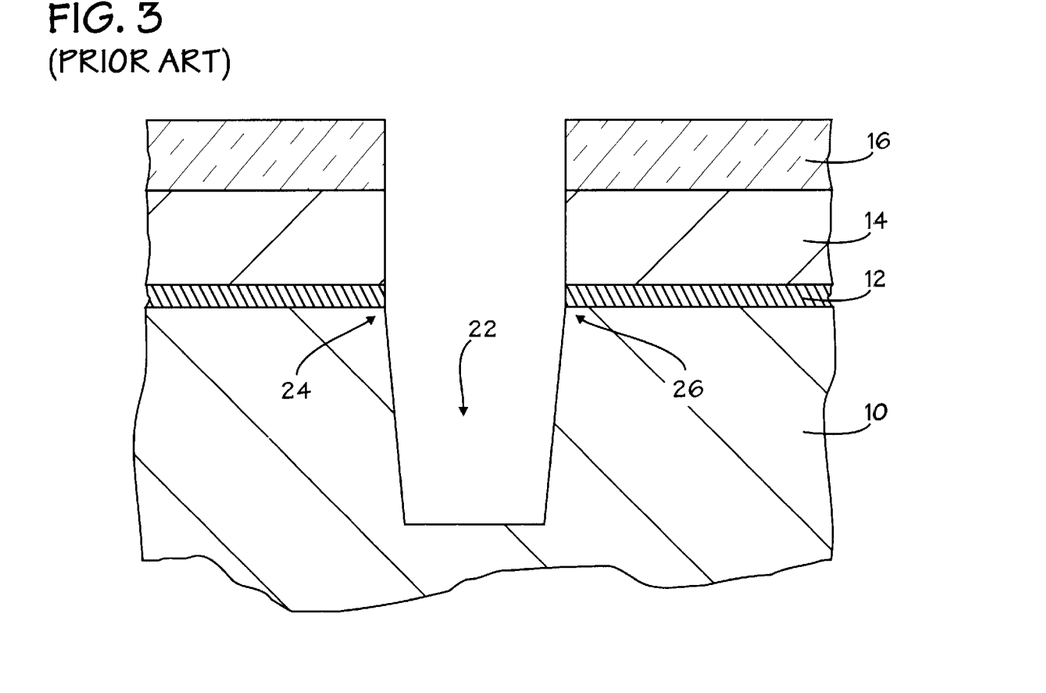
FIG. 3 is a cross-sectional view like FIG. 2 depicting conventional etch definition of an isolation trench in the substrate.

Referring now to FIG. 3, the etch chemistry is switched and an anisotropic etch is performed to establish a trench 22 using, for example, $HBr/Cl_2/O_2$ in an RIE. At the conclusion of the trench etch, the upper corners 24 and 26 of the substrate 10 are approximately contiguous with the overlying pad oxide layer 12 and silicon nitride layer 14.

Figure 4:
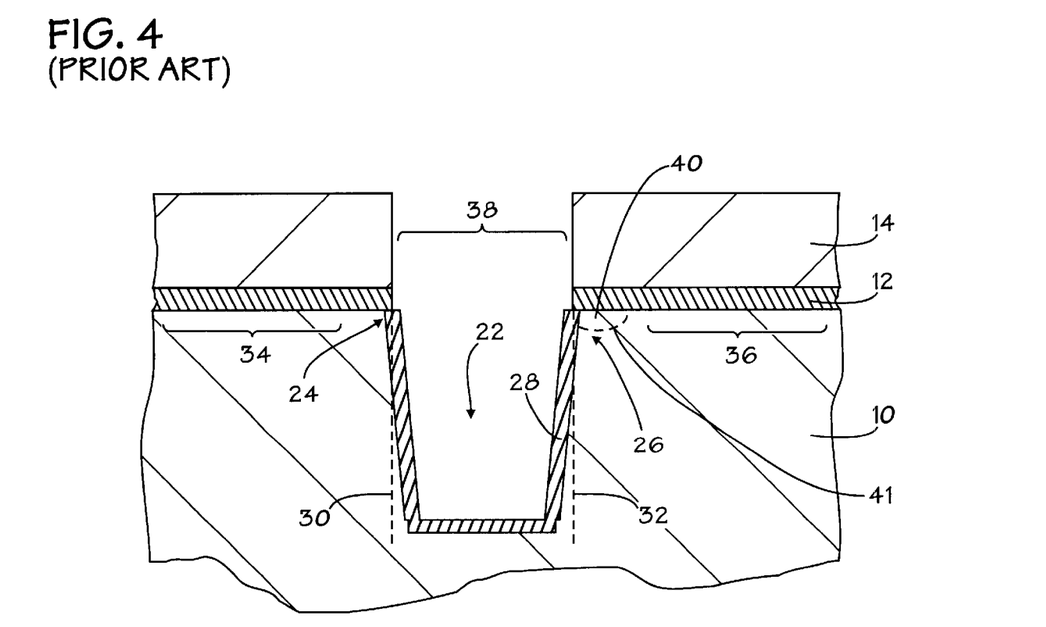
FIG. 4 is a cross-sectional view like FIG. 3 depicting conventional formation of a liner oxide layer in the trench.

Referring now to FIG. 4, a liner oxide layer 28 is formed on the bottom and sidewalls of the trench 20. The liner oxide layer 28 is typically formed by a thermal oxidation step. The oxidation is consumptive of the silicon 10 such that the upper corners 24 and 26 of the silicon substrate 10 move laterally away from the trench 22 and underneath the silicon nitride 14 and the pad oxide layer 12. The original positions of the corners 24 and 26 are indicated by the dashed lines 30 and 32.

As noted above, two potential disadvantages flow from the conventional fabrication process just described. To begin with, the lateral encroachment of the liner oxide layer 28 reduces the sizes of the silicon regions 34 and 36 positioned on either side of the trench 20. This may have the undesirable fallout of reducing the maximum drive current for devices formed in the regions 34 and 36. The other potential negative ramification is the possibility of unwanted attack of the substrate 10 in the vicinity of the corners 24 and 26 during subsequent removal of the silicon nitride layer 14 and the pad oxide layer 12. Following fabrication of the liner oxide layer 28, a bulk trench film material (not shown) is deposited over the silicon nitride layer 14 to fill the trench 22. Following a planarization step, the silicon nitride film 14 and possibly the pad oxide film 12 are removed using plasma or wet etching processes. Since the corners 24 and 26 are positioned beneath the silicon nitride film 14 and the pad oxide film 12, the bulk film material will have a width that corresponds only to the size of the opening 38 in the silicon nitride film 14. Thus, the bulk film material does not provide overlying protection of the corners 24 and 26. As a consequence, the pad oxide layer 12 can be easily compromised, producing an unwanted etch attack of the region 40 delineated by the dashed line 41. Stringers of conducting material may form in the region 40 and lead to shorts between devices.

Figure 5:
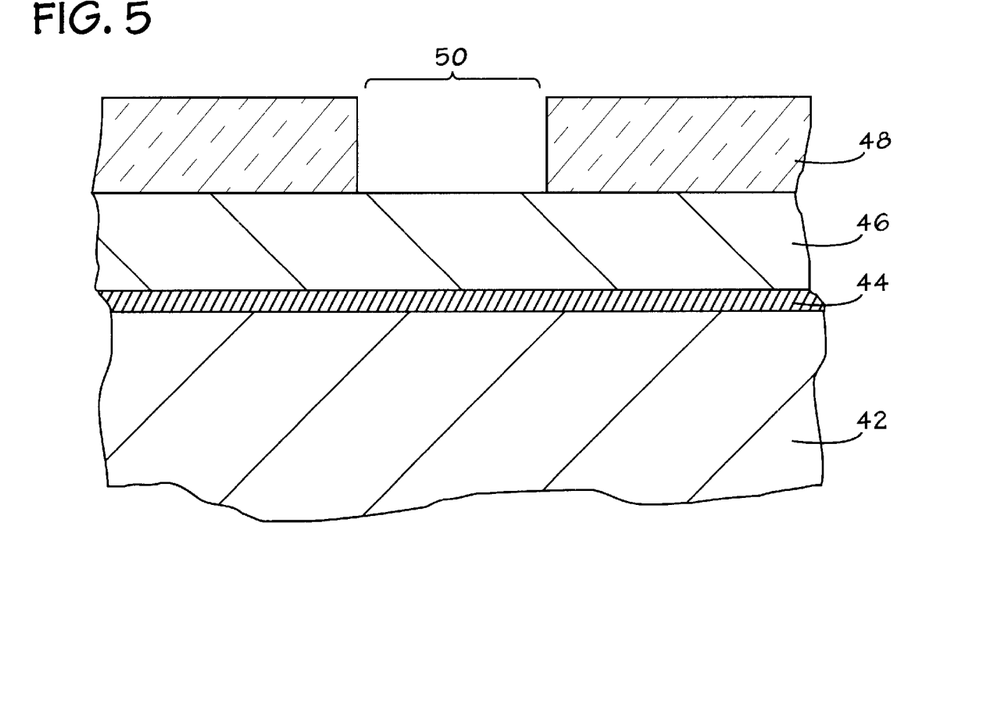
FIG. 5 is a cross-sectional view of an exemplary substrate with an oxide film, a silicon nitride film and a photomask formed thereon in accordance with the present invention.

An exemplary process flow for fabricating an isolation trench and an isolation structure formed therein in accordance with the present invention that obviates some of the aforementioned disadvantages may be understood by referring now to FIGS. 5, 6, 7, 8, 9, 10, 11 and 12 and initially to FIG. 5. A substrate 42 is coated with a pad oxide film 44 with a thickness of about 100 to 200 Å by, for example, thermal oxidation in an oxygen containing ambient, CVD or the like. The substrate 42 may be n-doped silicon, p-doped silicon, silicon-on-insulator or other suitable substrate materials. A silicon nitride film 46 is formed on the pad oxide layer 44 with a thickness of about 500 to 1500 Å by low pressure or plasma enhanced CVD.

A photomask 48 composed of photoresist or other well-known lithographic mask materials is patterned on the silicon nitride film 46 using well-known lithographic patterning techniques to define an opening 50 therein that will have the desired shape for a subsequently formed trench in the substrate 42.

Figure 6:
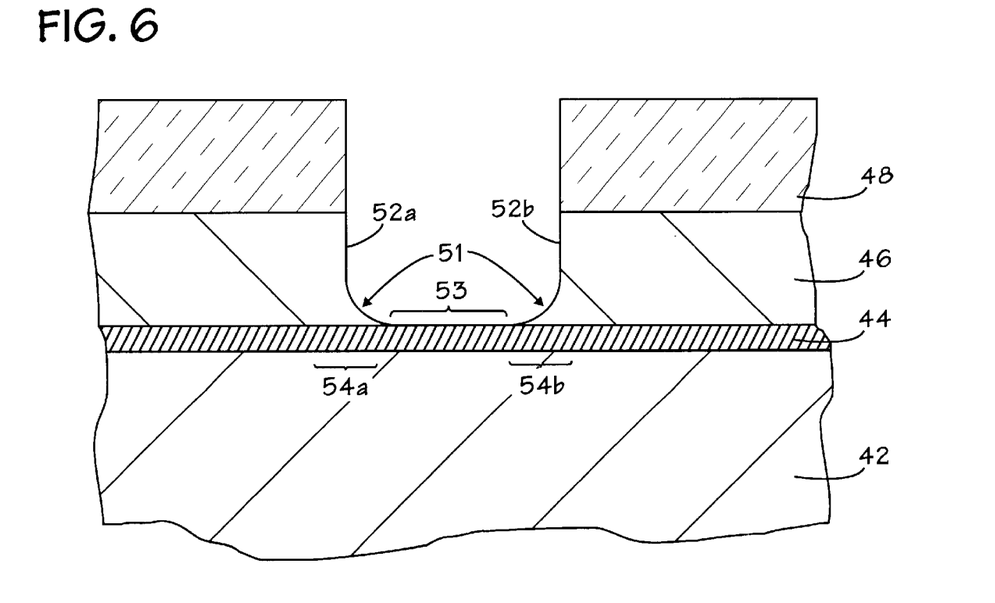
FIG. 6 is a cross-sectional view like FIG. 5 depicting directional etching of the silicon nitride film in accordance with the present invention.

Referring now to FIG. 6, a directional plasma etch of the silicon nitride film 46 is performed with the photomask 48 serving as an etch mask. A variety of well-known directional etching techniques may be used, such as, for example, RIE, chemical plasma etching or the like in conjunction with a variety of well-known chemistries, such as, for example, $NF_3$ and HBr or $CF_4$ and HBr. The etch chemistry is selected to produce a curved etch front 51 at the lower reaches of the sidewalls 52a and 52b of the silicon nitride film 46. Plasmas of $NF_3$/HBr and $CF_4$/HBr produce the curved etch front 51 through the action of neutral etchant flux, e.g., the flux of $CF_3^+$ or $NF_2^+$ ions. In an exemplary embodiment, RIE is used with a mixture of $CF_4$ and HBr. The etch may use the following parameters:

| | |
|---|---|
| $CF_4$ flow | about 90 sccm |
| HBr flow | about 9 sccm |
| Pressure | about 100 mtorr |
| Plate power | about 400–500 watts |
| Chuck temperature | about 50° C. |
| Helium backside cooling | about 10 torr |

The etch of the silicon nitride 46 and the oxide 44 will proceed at about 1400 Å/min and 1200 Å/min respectively.

Unlike the conventional process disclosed above in which endpoint is by timing alone, emission spectroscopy is used in conjunction with timing for endpoint determination. The goal is to perform the main etch of the silicon nitride film 46 until a portion 53 of the underlying pad oxide 44 is exposed while portions 54a and 54b to either side of the portion 53 remained covered by silicon nitride. The main etch endpoint is determined by a drop-off in the emission of cyanide from the plasma at 3468 Å. Optionally, spectroscopic examination of another plasma constituent may be used as an indicator of exposure of the portion 53.

Figure 7:
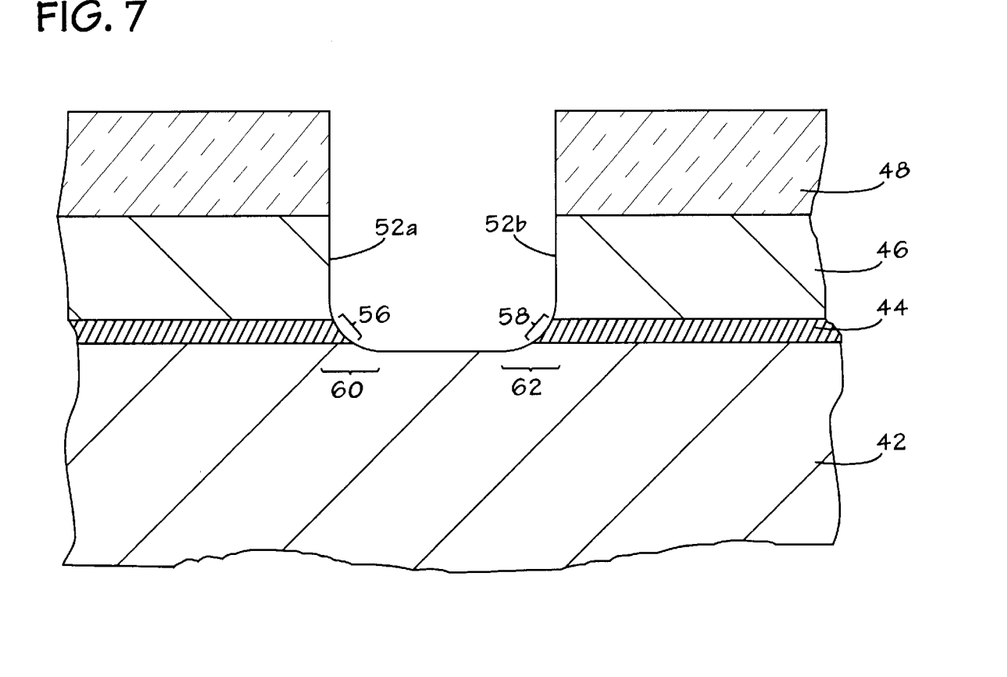
FIG. 7 is a cross-sectional view like FIG. 6 depicting directional etching of the oxide film in accordance with the present invention.

Regardless of the particular spectroscopy endpoint marker selected, when spectroscopy indicates that the portion 53 is exposed, the main etch is concluded and a timed overetch step is performed that is designed to just penetrate the pad oxide layer 44 as shown in FIG. 7. The goal of the timed overetch is to expose the underlying substrate 42 while leaving overhanging portions or ledges 56 and 58 consisting of respective portions of the pad oxide layer 44 and the silicon nitride layer 46. The ledges 56 and 58 will serve as etch masks for the underlying regions 60 and 62 of the substrate 42 during the subsequent etch formation of a trench 64 in the substrate shown in FIG. 8. The timing of the overetch step may be selected by an examination of the anticipated etch rate and thickness of the pad oxide layer 44. Optionally, the duration of the overetch may be selected as a percentage of the measured duration of the silicon nitride film main etch, that is, the time period between the commencement of the silicon nitride etch and the endpoint thereof as determined by emission spectroscopy.

The widths of the ledges 56 and 58 depend on the parameters of the main and overetch as well as the size of theetrench opening 64. The following table illustrates the width of each of the ledges 56 and 58 obtained for the etch parameters disclosed elsewhere herein and for different percentages of main etch duration:

| Etch Mixture | Overetch Duration (Percentage of Main Etch Duration) | Ledge Width |
|---|---|---|
| $CF_4$ and HBr | 5.0% | 10 nm |
| $CF_4$ and HBr | 7.5% | 7.5 nm |
| $CF_4$ and HBr | 15% | 5.0 nm |

Figure 8:
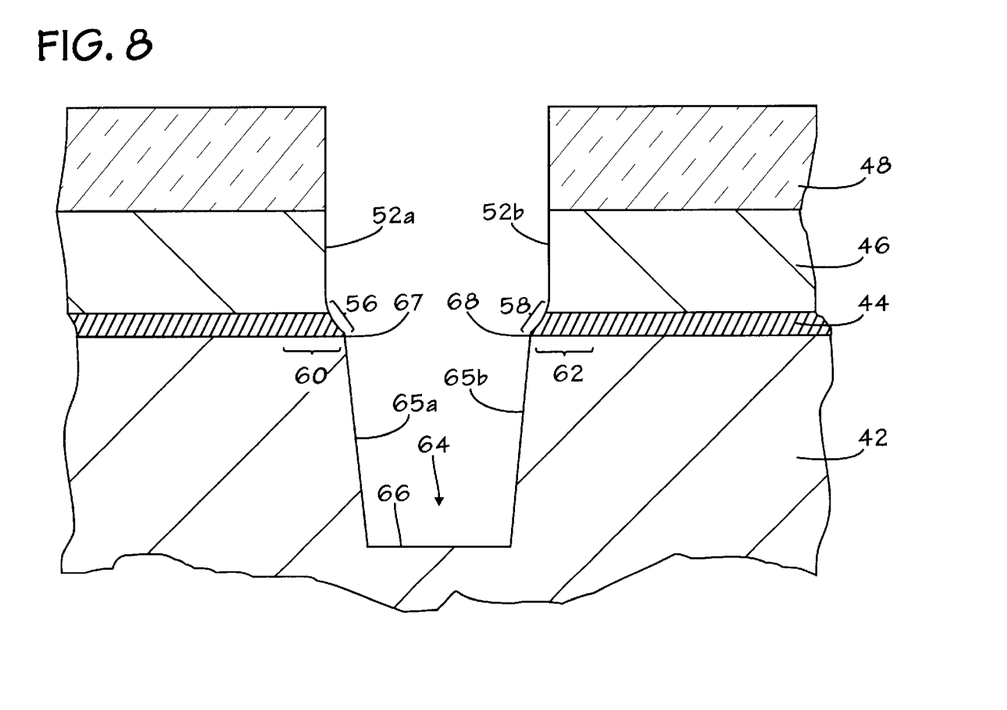
FIG. 8 is a cross-sectional view like FIG. 7 depicting directional etch definition of a trench in the substrate in accordance with the present invention.

Referring now to FIG. 8, the isolation trench 64 is formed in the substrate 42 to a depth of about 3000 to 5500 Å by performing a directional etch using RIE, chemical plasma etching or the like with chemistries suitable to anisotropically etch silicon. For example, HBr, $Cl_2$ and $O_2$ may be used with following parameters:

| | |
|---|---|
| $Cl_2$ flow | about 50 sccm |
| HBr flow | about 100 sccm |
| $O_2$ flow | about 5 sccm |
| Pressure | about 100 mtorr |
| Plate power | about 400–500 watts |
| Chuck temperature | about 50° C. |
| Helium backside cooling | about 10 torr |

The etch provides for sloped sidewalls 65a and 65b terminating at a trench bottom 66. The sidewalls 65a and 65b may have a slope of about 75 to 85°. During the trench etch, the overlying ledges 56 and 58 serve as small etch masks for the underlying regions 60 and 62 of the substrate 42. As a result, the upper corners 67 and 68 of the trench 64 project laterally inwardly from the edges 52a and 52b of the silicon nitride film 46. To ensure that the ledges 56 and 58 adequately protect the corners 67 and 68 during the etch, the etch mixture is selected to provide a high Si:SiO$_2$ selectivity so that premature erosion of the ledges 56 and 58 does not occur. The exemplary HBr/Cl$_2$/O$_2$ etch mixture disclose herein not only provides a desirable Si:SiO$_2$ etch selectivity, but also permits in-situ etching following the etch of the silicon nitride film 46 and the oxide film 44. In-situ processing is possible due to compatibility between CF$_4$/HBr or NF$_3$/HBr polymer formation and HBr/Cl$_2$/O$_2$ polymer formation.

Figure 9:
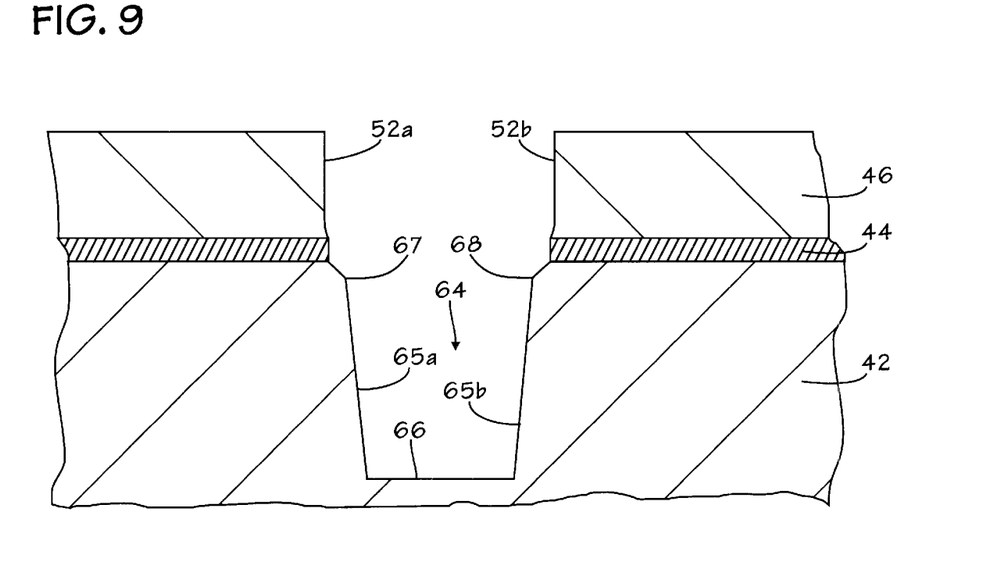
FIG. 9 is a cross-sectional view like FIG. 8 depicting completed etch definition of the trench in accordance with the present invention.

The trench 64 at the conclusion of the trench etch is illustrated in FIG. 9. As the etch of the trench 64 proceeds to conclusion, the ledges 56 and 58 depicted in FIG. 8 are removed as shown in FIG. 9. As the ledges 56 and 58 disintegrate, the corners 67 and 68 of the trench 64 become exposed and are etched, producing a rounding thereof as shown. Rounding of the upper corners 67 and 68 is desirable from a device reliability standpoint. Furthermore, the corners 67 and 68 are displaced laterally inwardly from the edges 52a and 52b of the silicon nitride film 46. Following the trench etch, the photomask 48 is stripped by well-known ashing, solvent stripping techniques, combinations of these or the like.

Figure 10:
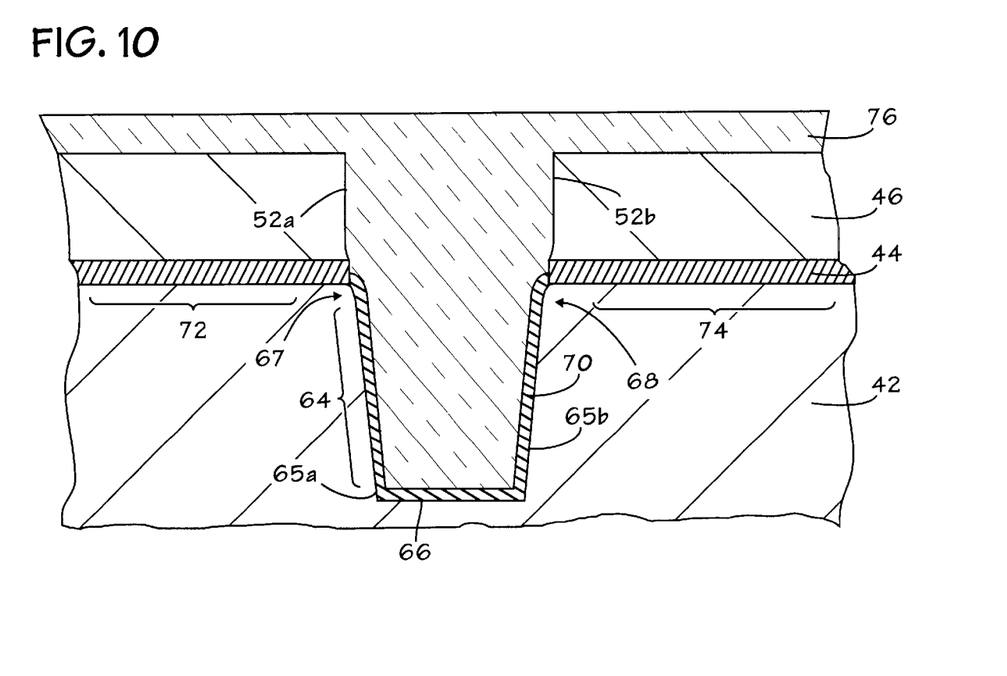
FIG. 10 is a cross-sectional view like FIG. 9 depicting liner insulating layer formation and bulk insulating material formation in the trench in accordance with the present invention.

Referring now to FIG. 10, a liner oxide film 70 is formed on the sidewalls 65a and 65b and bottom 66 of the trench 64. The film 70 may be formed by thermal oxidation or CVD as desired. In an exemplary embodiment, a dry oxidation step is performed at about 1000° C. in an oxygen ambient for 10 to 15 minutes to form the liner oxide layer 70 with a thickness of about 200 to 400 Å. The rounding of the shoulders 67 and 68 as well as their inward displacement from the sidewalls 52a and 52b of the silicon nitride film 46 results in the liner oxide film 70 forming without the undesirable recess beneath the edges 52a and 52b of the type referenced above. Thus, the sizes of active regions 72 and 74 are not unnecessarily reduced and the corners 67 and 68 of the trench 64 will be protected by the overlying bulk insulator material 76 that is deposited over the silicon nitride film 46 and into the trench 64. The bulk insulation material 76 may be composed of an insulating material suitable for trench isolation. For example, CVD tetra-ethyl-ortho-silicate or silane oxide may be used.

Figure 11:
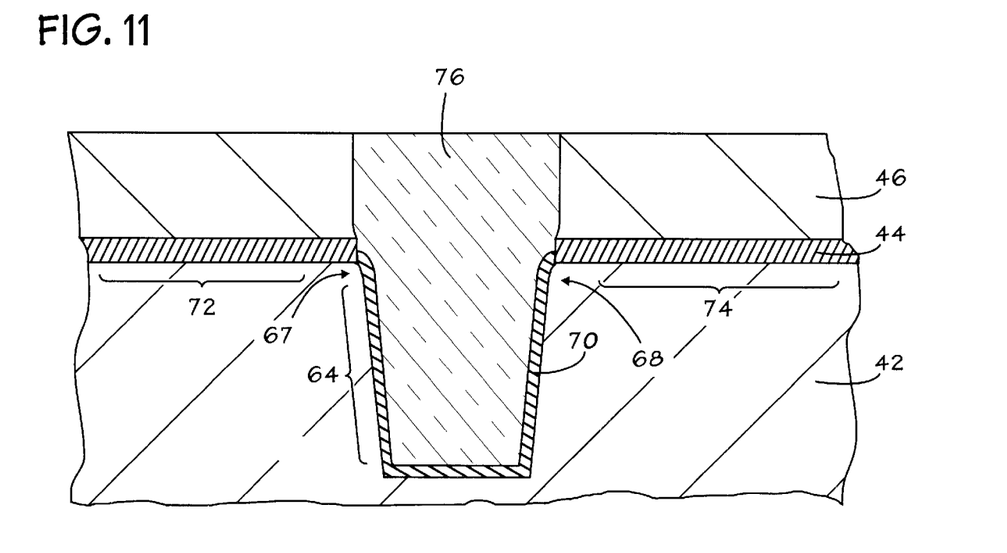
FIG. 11 is a cross-sectional view like FIG. 10 depicting planarization of the bulk insulating material in accordance with the present invention.
Figure 12:
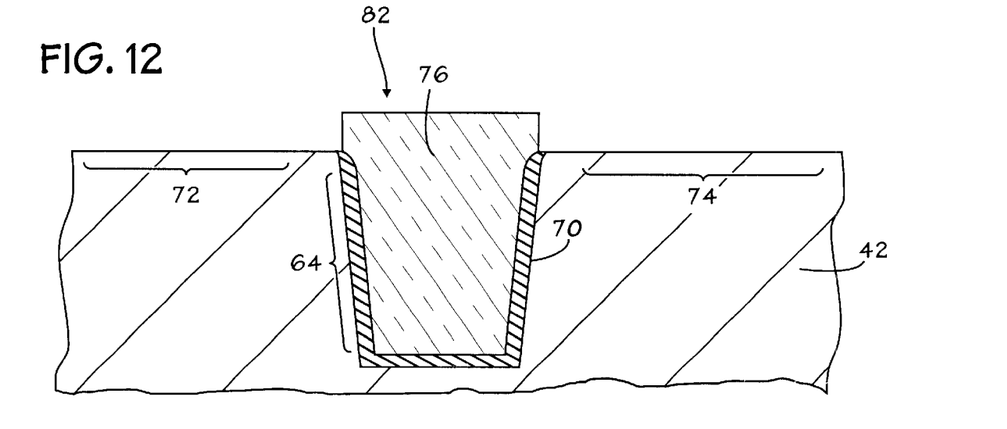
FIG. 12 is a cross-sectional view like FIG. 11 depicting removal of the silicon nitride and oxide films in accordance with the present invention.

Referring now to FIG. 11, the bulk insulator 76 is planarized to the silicon nitride film 46 by well-known CMP, etch back planarization or the like. Referring now also to FIG. 12, the silicon nitride film 46 may be removed using, for example, chemical plasma etching or a hot phosphoric acid dip. Note that the inward offset of the corners 67 and 68 enables the overlying bulk insulator material 76 to provide protection of the corners 67 and 68 during the removal of not only the silicon nitride film 46, but also the pad oxide film 44 if that particular film is also removed. For example, an HF wet etch may be performed to remove the pad oxide film 44 in anticipation of fabrication of circuit structures on the active areas 72 and 74. FIG. 12 depicts the completed isolation structure 82 consisting of the liner oxide layer 70 and the bulk insulating material 76. The pad oxide layer 44 depicted in FIG. 11 is shown removed. While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of fabricating a trench in a substrate, comprising:

forming an oxide film on the substrate;

forming a silicon nitride film on the oxide film;

etching an opening in the silicon nitride film having opposing sidewalls with a plasma until a first portion of the oxide film is exposed while second and third portions of the oxide film positioned on opposite sides of the first portion of the oxide film remain covered by first and second portions of the silicon nitride film that project inwardly from the opposing sidewalls;

etching the oxide film for a selected time period in order to expose a portion of the substrate, the first and second portions of the silicon nitride film protecting the second and third portions of the oxide film whereby first and second oxide/nitride ledges projecting inwardly from the opposing sidewalls are defined; and etching the substrate to form the trench, the first and second oxide/nitride ledges protecting underlying portions of the substrate whereby the trench forms with opposing shoulders projecting inwardly from the respective opposing sidewalls of the silicon nitride film.

2. The method of claim 1, wherein the substrate comprises silicon.

3. The method of claim 1, wherein the exposure of the first portion of the oxide film is determined by emission spectroscopy of the plasma.

4. The method of claim 3, wherein the emission spectroscopy of the plasma comprises examination of the emission of cyanide.

5. The method of claim 1, wherein the selected time period for the etching of the oxide film comprises a percentage of the duration of the etching of the opening in the silicon nitride film.

6. The method of claim 5, wherein the percentage comprises about 5 to 15 percent.

7. The method of claim 1, wherein the plasma comprises HBr and CF$_4$.

8. The method of claim 1, wherein the etching of the substrate to form a trench is performed in-situ after the etching of the oxide film.

9. The method of claim 1, comprising removing the silicon nitride layer.

10. A method of fabricating an isolation structure on substrate, comprising:

forming an oxide film on the substrate;

forming a silicon nitride film on the oxide film;

etching an opening in the silicon nitride film having opposing sidewalls with a plasma until a first portion of the oxide film is exposed while second and third portions of the oxide film positioned on opposite sides of the first portion of the oxide film remain covered by first and second portions of the silicon nitride film that project inwardly from the opposing sidewalls;

etching the oxide film for a selected time period in order to expose a portion of the substrate, the first and second portions of the silicon nitride film protecting the second and third portions of the oxide film whereby first and second oxide/nitride ledges projecting inwardly from the opposing sidewalls are defined;

etching the substrate to form a trench, the first and second oxide/nitride ledges protecting underlying portions of the substrate whereby the trench forms with opposing shoulders projecting inwardly from the respective opposing sidewalls of the silicon nitride film; and forming an insulator structure in the trench.

11. The method of claim 10 wherein the substrate comprises silicon.

12. The method of claim 10, wherein the exposure of the first portion of the oxide film is determined by emission spectroscopy of the plasma.

13. The method of claim 12, wherein the emission spectroscopy of the plasma comprises examination of the emission of cyanide.

14. The method of claim 10, wherein the selected time period for the etching of the oxide film comprises a percentage of the duration of the etching of the opening in the silicon nitride film.

15. The method of claim 14, wherein the percentage comprises about 5 to 15 percent.

16. The method of claim 10, wherein the plasma comprises HBr and $CF_4$.

17. The method of claim 10, wherein the etching of the substrate to form a trench is performed in-situ after the etching of the oxide film.

18. The method of claim 10, comprising removing the silicon nitride layer.

19. The method of claim 10, wherein the forming of the insulator structure in the trench comprises forming a liner insulating layer, depositing an insulating material on the liner insulating layer and planarizing the insulating material to the silicon nitride layer.

20. A method of fabricating a trench in a silicon substrate, comprising:

forming an oxide film on the silicon substrate;

forming a silicon nitride film on the oxide film;

etching an opening in the silicon nitride film having opposing sidewalls with a plasma until emission spectroscopy of the plasma indicates that a first portion of the oxide film is exposed while second and third portions of the oxide film positioned on opposite sides of the first portion of the oxide film remain covered by first and second portions of the silicon nitride film that project inwardly from the opposing sidewalls;

etching the oxide film for a selected time period in order to expose a portion of the substrate, the first and second portions of the silicon nitride film protecting the second and third portions of the oxide film whereby first and second oxide/nitride ledges projecting inwardly from the opposing sidewalls are defined; and etching the substrate to form the trench, the first and second oxide/nitride ledges protecting underlying portions of the substrate whereby the trench forms with opposing shoulders projecting inwardly from the respective opposing sidewalls of the silicon nitride film.

21. The method of claim 20, wherein the emission spectroscopy of the plasma comprises examination of the emission of cyanide.

22. The method of claim 20, wherein the selected time period for the etching of the oxide film comprises a percentage of the duration of the etching of the opening in the silicon nitride film.

23. The method of claim 22, wherein the percentage comprises about 5 to 15 percent.

24. The method of claim 20, wherein the plasma comprises HBr and $CF_4$.

25. The method of claim 20, wherein the etching of the substrate to form a trench is performed in-situ after the etching of the oxide film.

26. The method of claim 20, comprising removing the silicon nitride layer.

\* \* \* \* \*